United States Patent
Omachi et al.

(10) Patent No.: US 6,764,773 B2
(45) Date of Patent: Jul. 20, 2004

(54) HEAT-DISSIPATING SUBSTRATE, METHOD FOR MAKING THE SAME, AND SEMICONDUCTOR DEVICE INCLUDING THE SAME

(75) Inventors: Masahiro Omachi, Itami (JP); Akira Fukui, Itami (JP)

(73) Assignee: Sumitomo Electric Industrial Co., Ltd., Osaka (JP)

( * ) Notice: Subject to any disclaimer, the term of this patent is extended or adjusted under 35 U.S.C. 154(b) by 104 days.

(21) Appl. No.: 10/229,077

(22) Filed: Aug. 28, 2002

(65) Prior Publication Data

US 2003/0113578 A1 Jun. 19, 2003

(30) Foreign Application Priority Data

Aug. 31, 2001 (JP) ........................................ 2001-263401

(51) Int. Cl.⁷ ................................................. H01L 25/04
(52) U.S. Cl. ..................... 428/600; 428/687; 257/712; 257/729; 361/709; 216/102
(58) Field of Search ................................. 428/600, 614, 428/687; 257/675, 712, 720, 707, 796, 729; 361/709; 216/102, 103, 104

(56) References Cited

U.S. PATENT DOCUMENTS

| 3,400,057 | A | * | 9/1968 | Jefferson et al. ............. 205/50 |
| 3,958,554 | A | * | 5/1976 | Schmidt ...................... 126/651 |
| 5,976,711 | A | * | 11/1999 | Dearnaley .................... 428/641 |
| 6,183,874 | B1 | * | 2/2001 | Yamagata et al. ............ 428/472 |

FOREIGN PATENT DOCUMENTS

| JP | 58-179957 | * | 10/1983 |
| JP | 63-16458 | | 4/1988 |
| JP | 01-501489 | | 5/1989 |
| JP | 02-168073 | * | 6/1990 |
| JP | 02-243729 | | 9/1990 |
| JP | 03-024945 | * | 2/1991 |
| JP | 09-157773 | | 6/1997 |
| JP | 10-42579 | | 2/1998 |
| JP | 10-280082 | | 10/1998 |
| JP | 10-335538 | | 12/1998 |
| WO | WO 99/00959 | | 1/1999 |

\* cited by examiner

*Primary Examiner*—John J. Zimmerman
(74) *Attorney, Agent, or Firm*—McDermott Will & Emery LLP

(57) ABSTRACT

A heat-dissipating substrate is made of a composite material comprising a first composition primarily composed of aluminum and a second composition primarily composed of silicon carbide and/or silicon The heat-dissipating substrate has a recess in one of its main faces. The main faces have fine unevenness, and the maximum amplitude of the fine unevenness in the depth direction of a main face is smaller than the maximum length in the depth direction of composite particles comprising the first composition and the second composition or particles of the second composition, the particles being exposed at the surface of the main face.

20 Claims, 5 Drawing Sheets

HEAT-DISSIPATING SUBSTRATE, METHOD FOR MAKING THE SAME, AND SEMICONDUCTOR DEVICE INCLUDING THE SAME

BACKGROUND OF THE INVENTION

1. Field of the Invention

The present invention relates to heat-dissipating substrates suitable for semiconductor devices. In particular, the present invention relates to a heat-dissipating substrate comprising a composite material containing a first composition primarily composed of aluminum and a second composition primarily composed of silicon carbide and/or silicon, a method for making the heat-dissipating substrate, and a semiconductor device including the heat-dissipating substrate.

2. Description of the Background Art

Recently, the integration density of semiconductor devices has increased markedly, and heat generated in the semiconductor devices has also increased exponentially. Thus, heat-dissipating substrates used in semiconductor devices must have high heat dissipation and satisfactory matching of thermal expansion coefficient with semiconductor devices and components for the semiconductor devices.

Furthermore, lighter, thinner, and more compact semiconductor devices are developed; hence, heat-dissipating substrates must be thinner and more compact. Also, heat-dissipating substrates have been required to have various complicated shapes, and these heat-dissipating substrates need to be produced with high dimensional precision and low cost.

A known material for such heat-dissipating substrates is a composite material comprising a metal having a low thermal expansion coefficient and a high thermal conductivity, i.e., tungsten (W) or molybdenum (Mo), and another metal having a high thermal conductivity, i.e., copper (Cu). However, the W—Cu and Mo—Cu composite materials are expensive and heavy. When a heat-dissipating substrate made of such a known composite material is mounted onto a plastic motherboard, the motherboard and ball grid are easily deformed or damaged.

Under such circumstances, light ceramic materials having high thermal conductivity such as aluminum nitride (AlN) and silicon carbide (SiC) have been developed as materials for heat-dissipating substrates. However, ceramic materials have a disadvantage of high process cost since they cannot be easily processed. Countermeasure materials are aluminum (Al) and its alloy, which have high thermal conductivity and are light; however, these have low hardness and are easily damaged.

A variety of Al-based alloys and composite materials have been investigated. For example, a composite material of Al and silicon (Si) or a composite material of Al and a ceramic having high thermal conductivity is used for a heat-dissipating substrate. For example, Japanese Examined Patent Application Publication No. 63-16458 discloses a composite material of Al and Si (Al—Si composite material). Japanese Unexamined Patent Application Publication Nos. 1-501489, 2-243729, 9-157773, 10-280082, and 10-335538 disclose composite materials of Al and SiC (Al—SiC composite materials). Composite materials containing Al, Si, and SiC are also known.

However, since these composite materials contain hard SiC and Si particles, much time is required for finishing processes such as cutting and grinding, and high load is applied to the processing tools, which results in quick wear of the tools. Such high load applies considerable stress to the surfaces of the composite materials and causes deformation of the composite materials such as curvature. As described above, thinner substrates have been developed recently. Such thinner substrates are easily deformed by high load during the finishing process. Since both soft Al particles and hard SiC particles are present in the processed surface, the hard particles are readily scratched off by processing tools and the resulting cavities are filled with deformed Al particles. Furthermore, the surfaces processed with worn tools become more uneven and have low dimensional accuracy.

Japanese Unexamined Patent Application Publication No. 10-280082 discloses a method for making an Al—SiC composite material having a predetermined shape without processing such as cutting and grinding. In this method, a green compact having a shape substantially similar to the final shape is prepared, and surfaces of the green compact are covered with specific layers of silicon oxide or the like to prevent liquation of Al after firing. However, the formation of the specific layers on the surfaces of the compact is very troublesome.

In a thin metal substrate composed of Cu or Al, a shallow recess for mounting a semiconductor device is generally formed by chemical etching or corrosion. For example, WO99/0959 discloses an example of chemical etching for making a multichip module. However, chemical etching is predominantly applied to soft metal materials.

Japanese Unexamined Patent Application Publication No. 10-42579 discloses etching of Al—Si and Al—SiC materials for sliders, which are quite different from semiconductor devices. The abrasion resistance of the slider is improved by causing hard particles to protrude 2 $\mu$m or less from the surface by slightly etching the Al matrix after finish-machining the surface by cutting or polishing. This technology, however, does not take account of deformation of the material during cutting and polishing.

Various types of semiconductor packages for higher performance and advanced capabilities are developed. For example, packages of flip-chip mounting types shown in FIGS. 7 and 8 are employed for increased I/O terminals. In these drawings, reference numerals 1a and 1b denote heat-dissipating substrates, reference numeral 2 denotes a semiconductor device mounted on the heat-dissipating substrate, reference numeral 3 denotes a multichip-type wiring layer, reference numeral 4 denotes a ball grid (connection terminal). The heat-dissipating substrate 1a shown in FIG. 7 constitutes a lid whose peripheral frame is directly connected with the wiring layer 3. The heat-dissipating substrate 1b shown in FIG. 8 is of a flat plate and the heat-dissipating substrate 1b and the wiring layer 3 are hermetically sealed with a stiffener 5.

In compliance with the requirement of high performance, packages of flip-chip type, the number of the wiring layers 3 is increased. On the other hand, since the total thickness of the package is specified by a JEDEC (Joint Electron Device Engineering Council) standard, the heat-dissipating substrates 1a and 1b must be thinner so that the package complies with the standard. However, the above-described Al—SiC and Al—Si heat-dissipating substrates easily undergo deformation such as curvature as the thickness is reduced by cutting or grinding. As for the lid-type heat-dissipating substrate 1a shown in FIG. 7, in particular, it is difficult to further reduce the thickness thereof while maintaining high dimensional accuracy.

When the heat-dissipating substrate is used in a package, its product name and lot number are printed on a surface of the heat-dissipating substrate. Thus, the surface must be conditioned so that the print is clear. However, identification of printed data has been difficult in the case of the Al—SiC and Al—Si composite materials, because they exhibit dark or low gray metallic luster, although the color varies depending on the composition of the materials.

SUMMARY OF THE INVENTION

An object of the present invention is to provide a thin heat-dissipating substrate which comprises an Al-based composite material composed of Al—SiC, Al—Si, or the like and which does not undergo deformation such as curvature and has a surface that allows data printed thereon such as a product code and lot number to be clearly identified.

A heat-dissipating substrate according to the present invention is made of a composite material comprising a first composition primarily composed of aluminum and a second composition primarily composed of silicon carbide and/or silicon, and has a recess in one of the two main faces thereof, in which the maximum amplitude of the fine unevenness in the depth direction of the surfaces excluding the recess portion is smaller than the maximum length in the depth direction of the composite particles comprising the first composition and the second composition or the particles of the second composition that are exposed at the surface of the same main face.

Preferably, the two main faces have a roughness Ra of 0.2 to 2 $\mu$m in terms of the roughness Ra defined in JIS B 0651. Preferably, the two main faces excluding the recess portion are gray or light gray without exhibiting metallic luster.

A method for making a heat-dissipating substrate according to the present invention comprises the following steps: a step of preparing a composite material comprising a first composition primarily composed of aluminum and a second composition primarily composed of silicon carbide and/or silicon; a first etching step of forming a recess in one of the main faces of the composite material by chemical etching; and a second etching step of forming fine unevenness on the main faces by chemical etching such that the maximum amplitude of the fine unevenness in the depth direction of a main face is smaller than the maximum length in the depth direction of composite particles composed of the first composition and the second composition or particles composed of the second composition, which particles are exposed at the surface of the main face.

In the method of making a heat-dissipating substrate according to the invention, the chemical etching in the first etching step is performed with an alkaline or acidic aqueous etching solution containing 30 to 50 percent by mass of etchant and the chemical etching in the second etching step is performed with an alkaline or acidic aqueous etching solution containing 3 to 30 percent by mass of etchant. Preferably, the second alkaline or acidic aqueous etching solution further contains another etchant of an inorganic copper salt or chloride wherein the total etchant concentration in the solution is in the range of 3 to 50 percent by mass. The above-mentioned alkaline or acidic aqueous etching solutions may further contain hydrogen fluoride.

DETAILED DESCRIPTION OF THE INVENTION

The composite material that constitutes the heat-dissipating substrate according to the present invention comprises a first composition primarily composed of aluminum (Al), namely, pure Al or an Al alloy, and a second composition primarily composed of silicon carbide (SiC) and/or silicon (Si), namely, SiC, Si, or a mixture thereof. The Al alloy of the first composition may contain general metals defined in JIS H 4040 or JIS H 5202, such as Mg and Si.

Table I shows the thermal conductivity and thermal expansion coefficient of pure Al, SiC, and Si. Preferably, the first composition is composed of pure Al and the second composition is composed of high-purity SiC or Si to ensure high thermal conductivity. Preferably, SiC is of crystalline type exhibiting high thermal conductivity.

TABLE I

|  | Al | SiC | Si |
|---|---|---|---|
| Thermal Conductivity (W/m · K) | 220 | 320 | 140 |
| Thermal Expansion Coefficient (×10$^{-6}$/° C.) | 24 | 4 | 4.2 |

Figure 1:
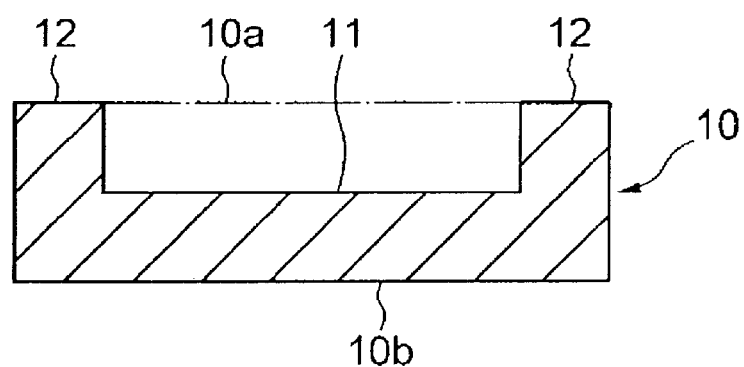
FIG. 1 is a schematic cross-sectional view of a heat-dissipating substrate according to the present invention.

Referring to FIG. 1, a heat-dissipating substrate 10 according to the present invention has one or more recess 11 on a main face 10a thereof. Here, a "main face" represents a face on which a semiconductor device is to be mounted or a face of the opposite side. The recess 11 may have any desired shape according to the package design. For example, the recess 11 may have a simple flat bottom (general lid type) or a waved bottom. The portion excluding the recess 11 of the main face 10a is a joint frame portion 12 to which a wiring layer and other components are bonded. A main face 10b that is opposite to the main face 10a is used as a face on which marks such as product name and lot number are printed.

Figure 3:
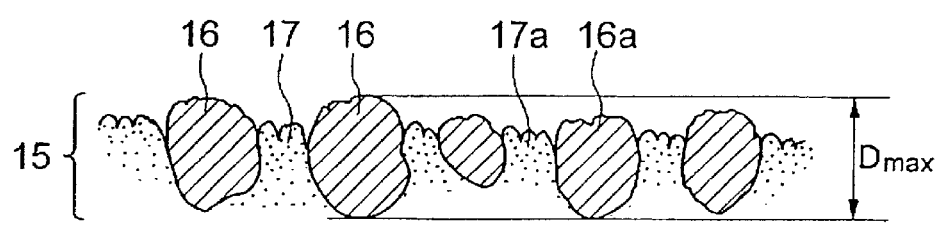
FIG. 3 is a schematic surface profile of fine unevenness on a main face of the heat-dissipating substrate according to the present invention.

The recess 11 is formed by chemical etching, as described in detail below. Furthermore, the surfaces excluding the recess 11 of the main faces 10a and 10b are subjected to another chemical etching so as to have fine unevenness of a specific profile. FIG. 3 shows a schematic view of such fine unevenness on the main faces. In reference to FIG. 3, the numeral 15 indicates a main face of the heat-dissipating substrate and 16 indicates hard particles exposed on the surface of the main face 15. The hard particles 16 are composite particles composed of the first composition and the second composition or particles composed of the second composition only. The numeral 17 designates the matrix portion composed of the first composition. In a microscopic view, the surface of the matrix portion 17 and the top face of each fine particle 16 exhibit fine unevenness, 17a and 16a, respectively. Also the interface between the matrix 17 and each fine particle 16 has a fine recess.

Figure 4:
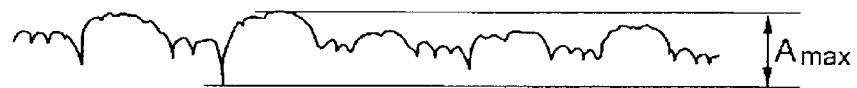
FIG. 4 is a profile curve of the surface unevenness shown in FIG. 3.

FIG. 4 illustrates a profile of microscopic surface unevenness at a cross-section orthogonal to the main face 15 in the case of excluding the recess 11 of the main faces 10a and 10b shown in FIG. 1. This profile curve corresponds to the surface unevenness shown in FIG. 3. The maximum amplitude $A_{max}$ of the unevenness in the depth direction in FIG. 4 is smaller than the maximum length $D_{max}$ of the hard particles 16 in the depth direction in FIG. 3.

As a result of such a surface profile, the first and second main faces 10a and 10b are gray or light gray without metallic luster. Furthermore, the joint frame portion 12 having a surface state of the above-mentioned profile as a part excluding the recess 11 of the main face 10a has high bonding strength and hence is superior in reliability of connection with other components disposed on the heat-dissipating substrate 10.

Preferably, the surface roughness Ra of the main faces 10a and 10b is in the range of 0.2 to 2 μm, wherein the surface roughness Ra is defined in Japanese Industrial Standard (JIS). A surface with a surface roughness Ra of less than 0.2 μm has metallic luster, which impairs clearness of printed letters and tends to decrease the strength of bonding with other components. A rough surface with a surface roughness Ra exceeding 2 μm tends to be more blackish, which also impairs clearness of printed letters. More preferably, the surface roughness Ra is in the range of 0.5 to 1.2 μm.

Preferably, the first composition of the composite material composing the heat-dissipating substrate of the present invention is in the range of 55 to 96 percent by mass, the balance being the second composition and inevitable impurities. If the first composition is less than 55 percent by mass, the etching rate and thus the efficiency in the formation of the recess tend to decrease. In a case where the first composition exceeds 96 percent by mass, the properties of the composite material become substantially the same as those of pure Al or an Al alloy; the composite material does not show properties that are industrially useful. For the same reasons, when the second composition is composed of SiC only, the first composition is preferably in the range of 60 to 95 percent by mass, and when the second composition is composed of Si only, the first composition is preferably 55 to 88 mass percent.

The composite particles composed of the first composition and second composition and the particles composed of the second composition preferably have an average particle size in the range of 5 to 40 μm and more preferably 10 to 20 μm. If their average particle size is less than 5 μm, the surface area of the particles containing large amounts of the second composition becomes large, so that the etching rate during the formation of the recess tends to decrease, whereby decreasing the efficiency of making the recess. If their average particle size exceeds 40 μm, the amplitude of the unevenness on the main faces excluding the recess increases, which makes it difficult to obtain a desired color of the main faces.

The heat-dissipating substrate having the above configuration has relatively high size accuracy and can be thinner than conventional substrates. For example, even when the ratio t/A of the maximum thickness t (mm) of the substrate between the main faces to the area A (mm$^2$) of a main face is 0.002 (mm$^{-1}$) or less, the curvature of the substrate can be reduced to 0.08 mm or less, and under ideal finishing conditions, to 0.05 mm or less.

Figure 7:
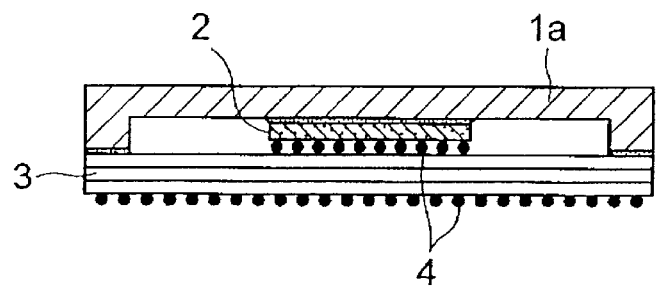
FIG. 7 is a cross-sectional view of a package using a lid-type heat-dissipating substrate.
Figure 8:
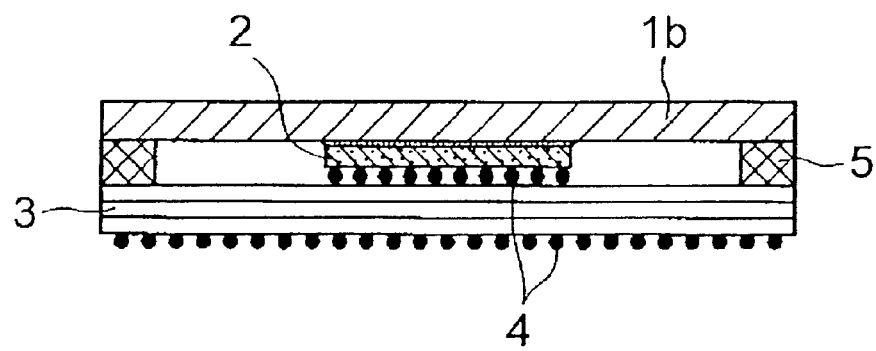
FIG. 8 is a cross-sectional view of a package using a planar heat-dissipating substrate.

The heat-dissipating substrate of the present invention has high rigidity, in addition to a high heat dissipation effect and high size accuracy; hence, the heat-dissipating substrate may be of a planar type shown in FIG. 8, of a lid type shown in FIG. 7 or of a thinner type with a more complicated shape.

A method for making the heat-dissipating substrate of the present invention will now be described. A composite material for the heat-dissipating substrate is prepared by a known method. Specifically, an Al—SiC or Al—Si composite material is prepared by an infiltration method, a sintering method, a casting method, or a combination thereof. Contaminants and an oxide layer on the surfaces of the resulting composite material are removed by a known means, such as barrel polishing and shot blasting.

When the infiltration method is employed in the present invention, a powder of the second composition and an organic binder to be added thereto as needed are granulated, and the granular mixture is molded into a desired shape to form a green compact. The void volume of the green compact can be adjusted by firing in a nonoxidizing atmosphere, if necessary, in order to ensure the void volume for impregnating the first composition. Thereafter, in a state in which the porous compact is brought into contact with the first composition, the first composition is melted by heating in a nonoxidizing atmosphere such that the porous compact is impregnated with the melted first composition so as to form a composite material.

In the case of a sintering method, a powder of the first composition and a powder of the second composition are mixed according to the composition of the final product, and an organic binder may be added thereto as needed, and the mixture may be granulated. A powder of the mixture is molded into a desired shape, and the green compact is heated at a temperature above the melting point of the first composition in a nonoxidizing atmosphere to liquid-sinter the green compact. A composite material is thereby prepared.

In both the infiltration method and the sintering method, a protective layer may be provided on the porous compact or the green compact to prevent the first composition from migrating to outer surfaces. Thus, a net-shape heat-dissipating substrate can be prepared by simple finishing of the resulting composite material.

In the case of casting method, the first composition is melted in a nonoxidizing atmosphere in a container, and a predetermined amount of powder of second composition is added thereto, and the mixture is thoroughly blended to attain uniform dispersion, and cast into a predetermined shape, and then cooled to form a composite material. In the above infiltration method, the first composition is generally 50 percent by mass or less because it is difficult to maintain the shape of the composite material if the pore volume of the porous second composition is larger. Therefore, the sintering method and the casting method that can be applied without restriction to composition are preferable in the present invention.

In the case of an Al—Si composite material, an alternative method may be employed, in which a powder is prepared by quenching sprayed molten metal having a desired composition, and the powder is hot-rolled. In addition various methods are available, depending on the composition and shape of the substrate material: sintering may be performed by hot-press, hot casting, or hot hydrostatic molding, and a hot plastic processing may be performed after these processes, etc.

The raw material for the first composition is powder in the case of the sintering method. In the case of the infiltration method and the casting method, however, it may be other forms such as granular, for example. In view of the final thermal conductivity, the first composition is preferably composed of pure Al or an Al alloy including minimal other element. The raw material for the second composition is powder and is preferably composed of SiC or Si whose purity is as high as possible. Preferably, SiC is crystalline SiC such as type 6H having high thermal conductivity.

The average particle size of the powder for the second composition is preferably in the range of 5 to 40 μm, and more preferably 10 to 20 μm. As described above, an average particle size of less than 5 μm results in a decreased etching rate during the etching process of the composite material for forming the recess. An average particle size exceeding 40 μm forms unevenness having large amplitude on the main faces, which results in difficulty in obtaining the desired tone of color on the main faces.

The resulting composite material is subjected to chemical etching two times, one for forming a recess and the other for controlling the roughness of the main faces. Specifically, in the first chemical etching step, a recess having a predetermined pattern is formed on a part of one of main faces. In the second chemical etching step, the roughness of the two main faces is adjusted so that the main faces have desired color and appearance. The order of the first and second etching steps is not limited. Masking for the chemical etching may be performed by any known process such as a photolithographic process, depending on the mask pattern.

In the chemical etching of the Al—SiC or Al—Si composite material, the Al component is selectively etched. As the etching of the Al component proceeds, and then SiC or Si particles are removed. These mechanisms are repeated during the etching. Al, which is amphoteric metal, can be etched with an acid or alkali. Examples of etchants include acids, i.e., sulfuric acid, nitric acid, and hydrochloric acid; and alkalis, i.e., sodium hydroxide. In view of process control and handling, the etchant is preferably in the form of an aqueous solution, but may be gaseous, for example, hydrogen chloride gas.

In an aqueous acidic or alkaline etchant solution, the concentration of the etchant is preferably controlled to 3 to 50 percent by mass in terms of a desired etching time (for example, 10 to 1,000 seconds). The chemical etching is generally performed at room temperature and may be performed at higher temperature when the etchant content is low or when a week etchant is used. When a gaseous etchant is used, the surfaces of the composite material are preferably heated during etching.

The first etching step should be performed at a high etching rate since the recess is formed on a main face of the composite material by etching Al and removing SiC or Si particles. Thus, the etchant content in the aqueous acid or alkaline etchant solution is in the range of 30 to 50 percent by mass. On the other hand, in the second etching step, the etchant content in the aqueous etchant solution is in the range of 3 to 30 percent by mass, and preferably 3 to 10 percent by mass so that Al is moderately removed, since the roughness of the main faces is adjusted by etching of Al and removal of hard particles is not essential.

In order to adjust etching rate, the etchant solution may contain an etchant such as salts or chloride of metals nobler than Al; for example, copper sulfate ($CuSO_4$), by 50 mass percent or more of the total etchants. In the case where such metal salt or chloride etchant is added in an aqueous etchant solution, the total etchant content is preferably in the range of 3 to 50 percent by mass, that is, the total etchant content is preferably somewhat higher than in the case where such metal salt or chloride etchant is not added. Alternatively, a chemical substance having the inverted property to the aqueous etchant solution (an alkaline substance for an acidic etchant solution or an acidic substance for an alkaline etchant solution) may be added to form a metal salt by the reaction of the chemical substance and the etchant.

Figure 5:
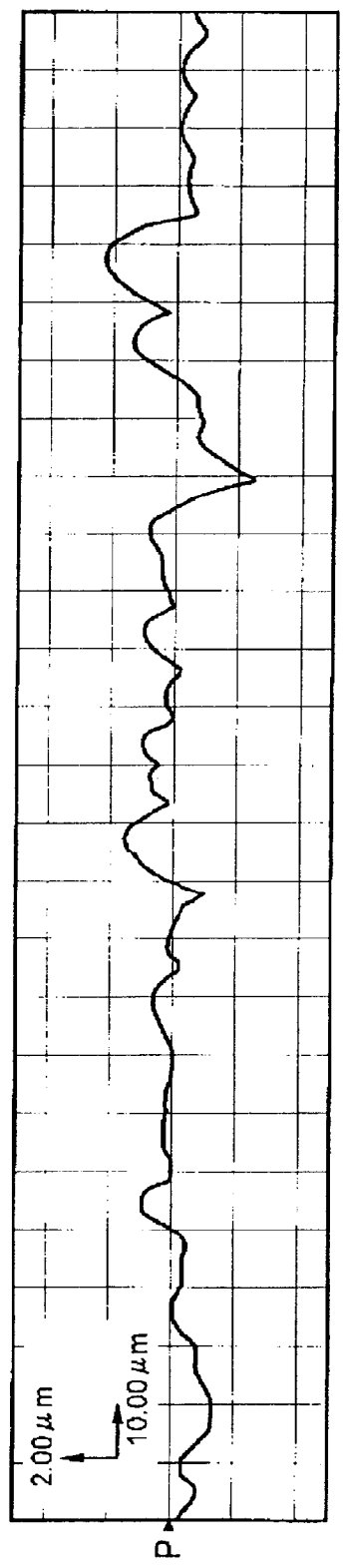
FIG. 5 shows a surface unevenness profile of a main face (excluding a recess portion) of an Al—SiC composite material having a specific composition.

In the second etching process, preferably, etching parameters such as etchant content and etching time are preliminarily determined by experiments to form a desired surface profile. For example, in the case of an Al—SiC(20%) composite material prepared by a casting method, desired surface unevenness can be obtained by etching at 40° C. for 30 to 120 seconds with an aqueous solution containing a 5 mass percent NaOH etchant or at 20° C. for 40 to 180 seconds in an aqueous solution containing a 20 mass percent NaOH etchant. FIG. 5 is a graph of a surface unevenness profile when the Al—SiC(20%) composite material is etched at 40° C. for 60 seconds in the aqueous solution containing 5 mass percent NaOH etchant.

Because powdered Al, SiC, and Si inevitably contain oxygen at their surfaces, each of the composite materials prepared by high-temperature treatment of these powdered raw materials has an ultra-thin layer of Al or Si oxide or Al silicate at its surface. It is preferable to remove the oxide or silicate layer since the layer reduces bonding strength of the heat-dissipating substrate to other components and increases thermal resistance at the surface of the heat-dissipating substrate. In order to remove the surface oxide or silicate layer, the liquid or gaseous etchant preferably contain a trace amount of hydrogen fluoride (HF) However, if the etchant in the second etching step contains 1 percent by mass or more of HF, it is difficult to obtain a desired surface profile (roughness).

Figure 2:
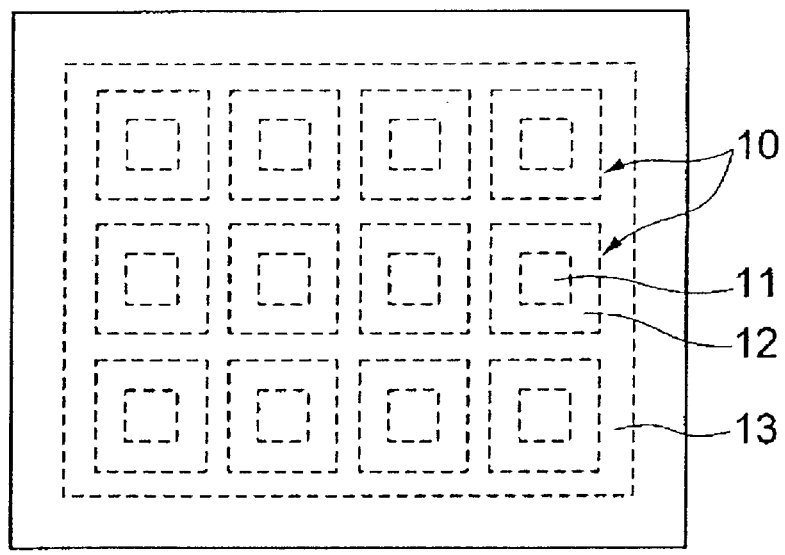
FIG. 2 is an schematic plan view of a composite material sheet for preparing a number of heat-dissipating substrates.

In the first and second etching steps, individual composite materials may be independently etched. Alternatively, an array of composite materials may be simultaneously etched. In this method, a plurality of heat-dissipating substrates can be prepared by one etching operation. For example, as shown in FIG. 2, an array of composite materials for preparing a plurality of heat-dissipating substrates 10 is provided. In the first etching step, the recess 11 of each heat-dissipating substrate 10 is formed, allowing a frame 13 to be left with a small thickness around the portions that are to become the individual heat-dissipating substrates 10. Then, the two main faces are subjected to the second etching step except for the recess 11. Thus, a number of heat-dissipating substrates 10 can be obtained simultaneously by removing the frame 13.

In the first etching step, Al is selectively etched while SiC, Si, or SiC—Si particles are removed from the composite material and a recess for mounting a semiconductor device and the like is formed in any shape efficiently with high accuracy. The recess formed in the first etching step is charcoal gray. This color is probably due to the rough surface formed by detachment of many particles, where the amplitude of the surface roughness in the depth direction is larger than the maximum length of the particles in the depth direction.

In the first etching step, the mass ratio of the first composition primarily composed of Al and the size of the SiC, Si, or SiC—Si particles have an effect on the entire shape of the etched substrate. That is, if the first composition is 55 percent by mass or more and the average particle size of the particles such as SiC is in the range of 5 to 40 $\mu$m and preferably 10 to 20 $\mu$m, the curvature of the resulting heat-dissipating substrate in the thickness direction can be suppressed to 0.08 mm or less even if the heat-dissipating substrate is thin. When the mass ratio or particle size of the first composition is out of the above ranges, the etching rate decreases such that much time is needed for forming the recess. It is likely that the substrate is unevenly etched and local deformation of the substrate is accelerated during the long etching time.

The composite material for the heat-dissipating substrate is charcoal gray with Al metallic luster when it is prepared by the infiltration process, the sintering process, or the casting process. In the second etching step, the main faces of the composite material become gray or light gray and do not have metallic luster. This is because the maximum amplitude of fine unevenness on the main faces in the depth direction is smaller than the maximum length of hard particles exposed at the main faces in the depth direction. Thus, a product name and lot number can be printed on the main face by laser irradiation or with black ink so as to be clearly identified.

The joint frame surrounding the recess of the main face also has fine unevenness exhibiting the same characteristics after the second etching step. Moreover, as described above, the heat-dissipating substrate has a small curvature in the thickness direction; hence, the joint frame has high bonding strength for connection with other components, whereby a highly reliable package can be obtained.

The surface roughness achieved by the second etching step of the two main faces excluding the recess is preferably in the range of 0.2 to 2 μm in terms of Ra according to JIS B 0651. A surface with a roughness Ra of less than 0.2 μm has metallic luster, which impairs visibility of the printed letters, and tends to decrease bonding strength for connection with other components.

Also, a rough surface with a roughness Ra exceeding 2 μm impairs visibility of the printed letters.

Such a surface roughness may be formed by a combination of the second etching step with any of surface finishing steps such as sand blasting and barrel polishing or with a rolling step using rollers having fine unevenness.

The additional step is preferably performed after the second etching step; however, such a combination may readily form a curvature over the entire heat-dissipating substrate in the case of a thin heat-dissipating substrate with a maximum thickness of 2.0 mm or less. In such a case, the curvature is larger than 0.08 mm in the thickness direction, for example.

In contrast, in the case of a heat-dissipating substrate prepared by the first and second etching steps according to the present invention, the curvature can be suppressed to 0.08 mm or less even if the thickness of the heat-dissipating substrate is 2.0 mm or less. In particular, a curvature of 0.05 mm, which is a requirement for commercial products, can be achieved for a thin heat-dissipating substrate in which the ratio (t/A) of the maximum thickness t (mm) between the two main faces to the area A (mm$^2$) of a main face is 0.002 (mm$^{-1}$) or less.

The present invention further provides a semiconductor device (including a package) using a heat-dissipating substrate which is produced by the first and second etching steps and which has a recess in a main face, wherein the main faces excluding the recess have fine unevenness (specific surface roughness).

EXAMPLE 1

For the first composition, powders each including Al whose purity is 99.4 mass percent and whose average particle size is 40μ were prepared: a pure Al powder (Al Powder 1), an atomized Al alloy powder containing 5 percent by mass of Si (Al Powder 2), and an atomized Al alloy powder containing 5 percent by mass of Mg (Al Powder 3). For the second composition, SiC and Si powders, each having a purity of 99.8 percent by mass and an average particle size shown in Table II were prepared.

These powders were mixed according to the composition for the composite material shown in Table II, and each mixture was molded into a square planar green compact with a length (width) of 50 mm and a thickness of 10 mm. The green compacts were heated to 665° C. in a belt furnace of a nitrogen atmosphere and held at the temperature for 30 minutes for sintering to obtain composite materials, which were each hot-rolled into a sheet of 1.0 mm in thickness.

TABLE II

| | Composition of Composite Material | | | |
|---|---|---|---|---|
| | | | | Second Composition |
| Sample | First Composition | SiC | Si | Average Particle Size (μm) |
| 1 | Al Powder 1: 53 | — | 47 | 15 |
| 2 | Al Powder 1: 55 | — | 45 | 15 |
| 3 | Al Powder 1: 70 | — | 30 | 15 |
| 4 | Al Powder 1: 80 | — | 20 | 15 |
| 5 | Al Powder 1: 88 | — | 12 | 15 |

TABLE II-continued

| | Composition of Composite Material | | | |
|---|---|---|---|---|
| | | | | Second Composition |
| Sample | First Composition | SiC | Si | Average Particle Size (μm) |
| 6 | Al Powder 1: 96 | — | 4 | 15 |
| 7 | Al Powder 1: 53 | 47 | — | 15 |
| 8 | Al Powder 1: 55 | 45 | — | 15 |
| 9 | Al Powder 1: 60 | 40 | — | 15 |
| 10 | Al Powder 1: 80 | 20 | — | 15 |
| 11 | Al Powder 1: 95 | 5 | — | 15 |
| 12 | Al Powder 1: 96 | 4 | — | 15 |
| 13 | Al Powder 1: 80 | 20 | — | 3 |
| 14 | Al Powder 1: 80 | 20 | — | 5 |
| 15 | Al Powder 1: 80 | 20 | — | 10 |
| 16 | Al Powder 1: 80 | 20 | — | 20 |
| 17 | Al Powder 1: 80 | 20 | — | 25 |
| 18 | Al Powder 1: 80 | 20 | — | 40 |
| 19 | Al Powder 1: 80 | 20 | — | 43 |
| 20 | Al Powder 1: 60 | 30 | 10 | 15 |
| 21 | Al Powder 1: 70 | 22 | 8 | 15 |
| 22 | Al Powder 1: 80 | 15 | 5 | 15 |
| 23 | Al Powder 2: 55 | 45 | — | 15 |
| 24 | Al Powder 2: 70 | 30 | — | 15 |
| 25 | Al Powder 2: 80 | 20 | — | 15 |
| 26 | Al Powder 2: 95 | 5 | — | 15 |
| 27 | Al Powder 3: 80 | 20 | — | 15 |

Each resulting composite material sheet had a charcoal gray surface with metallic luster. The metallic luster tended to increase according to the increase in the ratio of the first composition. The surface roughness Ra of each composite material sheet was measured. A cut piece was prepared from the composite material sheet, and the thermal conductivity and the thermal expansion coefficient of each cut piece were measured by a laser flash method and a differential transformer, respectively. These results are shown in the column "Properties of Unetched Composite Material" in Table III.

Each composite material sheet was immersed into an aqueous 10 mass percent NaOH solution at 30° C. for 60 seconds to etch the surfaces of the composite material sheet (the second chemical etching step). The surface roughness Ra of the etched composite material sheet was measured and the surface color was observed. The results are shown in the column "Properties of Etched Composite Material" in Table III. The state of surfaces at this stage corresponds to the surface roughness of the main faces excluding the recess of the composite material according to the present invention.

Each composite material sheet was subjected to chemical etching (corresponding to the first etching step in the present invention) along a pattern shown by dotted lines in FIG. 2 to separate heat-dissipating substrates 10 and to form a recess 11 on each heat-dissipating substrate 10. More specifically, after a surface of the composite material sheet, except for portions corresponding to the recesses 1, was masked by a photolithographic process, the sheet was immersed in an aqueous 30 mass percent NaOH solution at 30° C. for 30 to 60 seconds to form the square recesses 11 with a length (width) of 15 mm and a depth of 0.5 mm. Next, portions other than the frame 13 were masked in the same manner, and the sheet was immersed in the same NaOH solution at 30° C. for 30 to 60 seconds for etching.

In all of the twelve lid-type heat-dissipating substrates thus prepared, each recess was charcoal gray, whereas other portions of the faces were gray or light gray without metallic luster as shown in Table III, so that letters printed on the faces by laser irradiation or with black ink were easily readable. Each heat-dissipating substrate had a length (width) of 30 mm, a maximum thickness of 1 mm, and a thickness at the recess of 0.5 mm.

Figure 6:
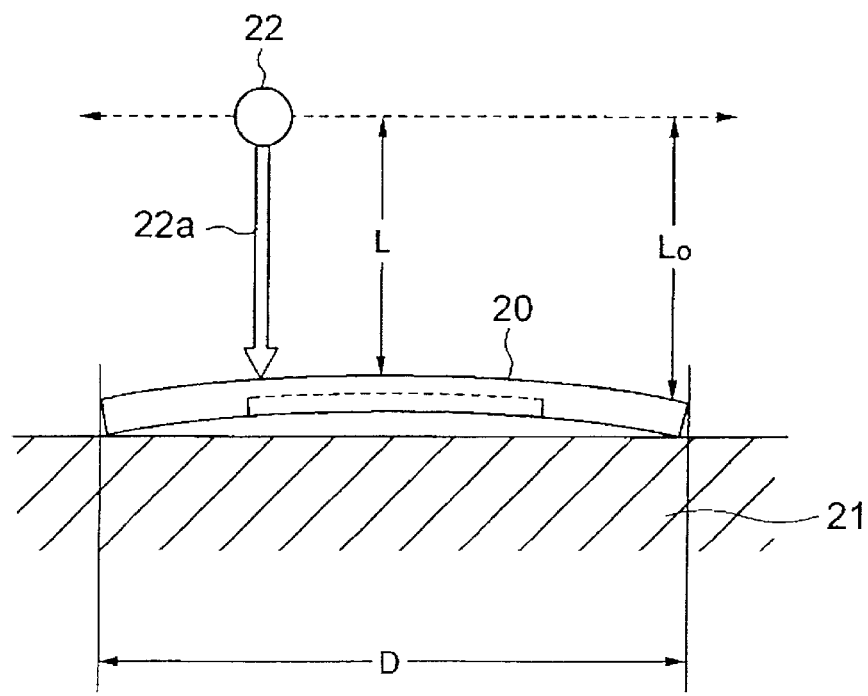
FIG. 6 schematically illustrates a method for measuring the curvature of a substrate.

The curvature of each heat-dissipating substrate was measured. The results are shown in the column "Properties of Etched Composite Material" in Table III. The measurement of curvature was performed as shown in FIG. 6. More specifically, the heat-dissipating substrate 20 was placed on a platen 21, putting the main face having the recess downward, and a laser beam 22a was emitted from a laser light source 22 to scan along two diagonal lines of the main faces on the upper side so as to measure the distance from the light source 22 to the main face. The curvature was defined as larger one of the ratios $(L_0-L)/D$ calculated for the two diagonal lines, where the scanning distance in each diagonal line was D (mm) and the minimum distance and maximum distance from the light source 22 to the main face were L (mm) and $L_0$ (mm), respectively.

Using the above-described hot-rolled sheets with a thickness of 1 mm, samples having a length (width) of 30 mm and a thickness of 1 mm were prepared in the same quantity as in Table III by mechanical cutting and polishing, and then the recess portion and main faces thereof were subjected to etching under the same conditions as in the above chemical etching steps. The curvature of theses samples was also measured. The curvature of all the samples exceeded 1.0 mm.

Each heat-dissipating substrate was subjected to 500 cooling/heating cycles, each cycle consisting of holding the sample at −60° C. for 30 minutes and then at +150° C. for 30 minutes. Then, the curvature of the heat-dissipating substrate was measured in the same manner as described above. The curvature of the heat-dissipating substrate according to the present invention did not substantially change by this cooling/heating cycles.

EXAMPLE 2

Using the same powders as those in EXAMPLE 1, composite materials having the compositions shown in Table II were prepared by a casting process. That is, a powder of the first composition was melt at 680° C. in a nitrogen atmosphere, and a SiC or Si powder of the second composition was added to the melt and thoroughly mixed to be dispersed into the melt. Then, the melt was cast into a mold having dimensions of 200 mm×100 mm×20 mm and cooled to produce a composite material. The composite material was rolled into a sheet with a thickness of 2.0 mm as in EXAMPLE 1.

Each of the resulting composite material sheets had charcoal gray surfaces with metallic luster. The metallic luster became noticeable as the first composition content increased. The density of each sheet was almost the same as that in EXAMPLE 1. The thermal conductivity of each sheet was slightly (up to about 8%) lower than that of the corresponding sheet by the sintering process shown in Tables II and III, while the thermal expansion coefficient was slightly (up to about 5%) higher than that of the corresponding sheet by the sintering process.

Each composite material sheet was immersed into an aqueous 10 mass percent NaOH solution as in EXAMPLE 1 (the second chemical etching step). The etched faces were gray or light gray without metallic luster, so that letters printed on the faces were easily readable.

Each sheet of the composite material had a size of about 200 mm×1,000 mm×2 mm. The sheet was masked such that 180 square substrates, each having a length (width) of 30 mm and a thickness of 2 mm, were produced. The sheet was subjected to chemical etching as in EXAMPLE 1 to separate

TABLE III

| | Properties of Unetched Composite Material | | | Properties of Etched Composite Material | | |
|---|---|---|---|---|---|---|
| Sample | Thermal Conductivity (W/m · K) | Thermal Expansion Coefficient (×10$^{-6}$/° C.) | Surface Roughness Ra (μm) | Surface Roughness Ra (μm) | Curvature (mm) | Surface Color |
| 1 | 180 | 14.5 | 0.2 | 1.2 | 0.07 | light gray |
| 2 | 182 | 14.9 | 0.2 | 1.0 | 0.05 | |
| 3 | 190 | 18.0 | 0.15 | 0.9 | 0.05 | |
| 4 | 200 | 18.5 | 0.15 | 0.9 | 0.05 | |
| 5 | 208 | 19.3 | 0.15 | 0.9 | 0.04 | |
| 6 | 214 | 21.0 | 0.17 | 1.2 | 0.03 | light gray (slight luster) |
| 7 | 263 | 14.2 | 0.2 | 1.2 | 0.07 | light gray |
| 8 | 260 | 15.0 | 0.2 | 1.2 | 0.06 | |
| 9 | 253 | 16.0 | 0.15 | 1.0 | 0.04 | |
| 10 | 235 | 20.0 | 0.15 | 1.0 | 0.03 | |
| 11 | 224 | 23.0 | 0.17 | 1.1 | 0.03 | |
| 12 | 221 | 23.5 | 0.17 | 1.1 | 0.03 | light gray (slight luster) |
| 13 | 232 | 19.8 | 0.1 | 0.9 | 0.06 | light gray |
| 14 | 234 | 19.8 | 0.1 | 0.9 | 0.05 | |
| 15 | 235 | 20.0 | 0.15 | 1.0 | 0.02 | |
| 16 | 236 | 20.0 | 0.15 | 1.0 | 0.02 | |
| 17 | 236 | 20.2 | 0.16 | 1.5 | 0.04 | gray |
| 18 | 237 | 20.4 | 0.2 | 1.6 | 0.04 | |
| 19 | 238 | 20.5 | 0.2 | 1.7 | 0.06 | charcoal gray |
| 20 | 178 | 15.4 | 0.15 | 1.1 | 0.05 | light gray |
| 21 | 237 | 18.4 | 0.15 | 1.0 | 0.04 | |
| 22 | 228 | 20.3 | 0.15 | 1.0 | 0.04 | |
| 23 | 214 | 13.0 | 0.1 | 1.0 | 0.02 | |
| 24 | 206 | 14.6 | 0.15 | 0.9 | 0.03 | |
| 25 | 202 | 17.5 | 0.15 | 0.9 | 0.03 | |
| 26 | 194 | 22.0 | 0.2 | 1.0 | 0.03 | |
| 27 | 198 | 16.0 | 0.13 | 0.8 | 0.03 | | the 180 lid-type heat-dissipating substrates and to form a square recess with a length (width) of 15 mm and a depth of 1 mm on each heat-dissipating substrate. Some of these heat-dissipating substrates were subjected to measurement of the curvature before and after the cooling/heating cycles described in EXAMPLE 1. The curvature was substantially the same as that shown in Tables II and III and was substantially not affected by the cooling/heating cycles.

EXAMPLE 3

Composite materials with a length (width) of 30 mm and a thickness of 1.0 mm having the same composition as that of Sample 10 of Table II in EXAMPLE 1 were prepared by the sintering and rolling methods described in EXAMPLE 1, and the relationship between the surface roughness and chemical etching conditions was investigated. The chemical etching conditions were varied as shown in Table IV. The surface color of each etched sample was observed and the surface roughness Ra of each sample was measured. These results are shown in Table V. The surfaces of the unetched composite materials of Sample 10 were charcoal gray with metallic luster.

TABLE IV

| Sample | Etchant Composition (percent by mass) | Etching Time (min) |
|---|---|---|
| 10-1 | 8% $H_2SO_4$ aqueous solution | 30 |
| 10-2 | 10% $H_2SO_4$ aqueous solution | 30 |
| 10-3 | 15% $H_2SO_4$ aqueous solution | 30 |
| 10-4 | 12% $H_2SO_4$ + 12% $CuSO_4$ aqueous solution | 30 |
| 10-5 | 32% $H_2SO_4$ aqueous solution | 30 |
| 10-6 | 8% $HNO_3$ aqueous solution | 30 |
| 10-7 | 8% $HNO_3$ + 0.7% HF aqueous solution | 10 |
| 10-8 | 8% $HNO_3$ + 0.4% HF aqueous solution | 10 |
| 10-9 | 8% NaOH aqueous solution | 30 |
| 10-10 | 10% NaOH aqueous solution | 30 |
| 10-11 | 15% NaOH aqueous solution | 30 |
| 10-12 | 32% NaOH aqueous solution | 30 |
| 10-13 | 12% NaOH + 12% $CuSO_4$ aqueous solution | 30 |
| 10-14 | 48% $H_2SO_4$ aqueous solution | 3 |
| 10-15 | 52% $H_2SO_4$ aqueous solution | 3 |

Each etched composite material with a length and width of 30 mm and a thickness of 1.0 mm was subjected to chemical etching to form a recess as in EXAMPLE 1.The resulting heat-dissipating substrates were evaluated with respect to their properties for bonding with a semiconductor device component.

Test pieces A having a recess on a main face thereof and an Au—Sn solder metallized layer on the other main face thereof were prepared. A copper wire of 1 mm in diameter was perpendicularly fixed to the main face of each test piece through a semispherical Al—Sn solder layer formed thereon with a diameter of 5 mm. With each of the five test pieces A thus prepared, evaluation as to whether or not the copper wire was detached from the substrate was done in a manner in which the copper wire was pulled upward at a rate of 5 mm/sec in a direction perpendicular to the substrate and such state was maintained for 15 minutes while each substrate was fixed. As a result, none of the copper wires were detached from any substrates. However, minute cracks were found in the metallized layer of Sample 10-15.

Test pieces B (package) were prepared, in which a substrate was provided with a recess on its main face and a tungsten metallized layer and a nickel plate layer were formed on the main face, and laminated circuits having the same size as the substrate (width and length: 30 mm×30 mm) were bonded on top of these layers through an Au—Sn solder, wherein the laminated circuits were composed of five aluminum nitride ceramic layers on each of which a tungsten pattern circuit is formed. Each of the test pieces B was subjected to cooling/heating cycles as in EXAMPLE 1 and the curvature thereof was measured before and after the cooling/heating cycles as described in EXAMPLE 1 and FIG. 6. The results are shown in Table V.

TABLE V

| | | | Curvature | |
|---|---|---|---|---|
| | After Etching | | Before | After |
| Sample | Surface Color | Ra ($\mu$m) | Heat cycles | Heat cycles |
| 10-1 | light gray | 0.5 | 0.03 | 0.03 |
| 10-2 | light gray | 0.8 | 0.03 | 0.03 |
| 10-3 | gray | 1.6 | 0.05 | 0.06 |
| 10-4 | light gray | 0.7 | 0.02 | 0.02 |
| 10-5 | gray | 1.8 | 0.06 | 0.06 |
| 10-6 | light gray | 0.6 | 0.03 | 0.03 |
| 10-7 | gray | 1.7 | 0.05 | 0.06 |
| 10-8 | light gray | 1.0 | 0.03 | 0.03 |
| 10-9 | light gray | 0.6 | 0.03 | 0.03 |
| 10-10 | light gray | 0.8 | 0.03 | 0.03 |
| 10-11 | gray | 1.5 | 0.05 | 0.05 |
| 10-12 | gray | 2.0 | 0.05 | 0.05 |
| 10-13 | light gray | 2.0 | 0.02 | 0.02 |
| 10-14 | light gray | 1.9 | 0.06 | 0.08 |
| 10-15 | slightly dark gray | 2.4 | 0.09 | 0.12 |

The above results demonstrate that the surface of the substrate is gray or light gray suitable for identification of printed letters when the etchant content in the second chemical etching step is 30 percent by mass or less. When the etchant content is 10 percent by mass or less, the surface is light gray more suitable for identification of printed letters.

By adding a salt of a nobler metal than Al to the aqueous acidic or alkaline etchant solution, a light gray surface is obtainable even if the acid or alkali content exceeds 10 percent by mass. Addition of 0.5 percent by mass of HF to the sulfuric acid solution reduces the etching time.

EXAMPLE 4

According to the same compositions as those in Samples 4 and 9 in Table II in EXAMPLE 1, composite material sheets with various thicknesses shown in Table VI were prepared by the sintering and rolling processes shown in EXAMPLE 1. Each composite material sheet was immersed in an aqueous 10 mass percent NaOH solution to control surface roughness (the second chemical etching step according to the invention) under the same conditions as those in EXAMPLE 1. Subsequently, each composite material sheet was subjected to chemical etching (the first etching step in the present invention) using an aqueous 30 mass percent NaOH solution as in EXAMPLE 1 to separate substrates and to form a recess in a main face of each substrate. Thus, heat-dissipating substrates having a length (width) of 30 mm (main face area (A): 900 $mm^2$) were produced in various thickness (t).

After that, a tungsten metallized layer and a nickel plate layer were formed on the main face opposite to a main face having a recess, and laminated circuits composed of five aluminum nitride ceramic layers each having a tungsten pattern circuit were bonded onto these layers with an Au—Sn solder. Each test piece thus prepared was subjected to cooling/heating cycles as in EXAMPLE 1 and the curvature was measured before and after the cooling/heating cycles by the method shown in FIG. 6 and EXAMPLE 1. The results are shown in Table VI in which t/A denotes the rate of the maximum thickness t (mm) between the two main faces to the area A (900 $mm^2$) of a main face.

As shown in Table VI, the curvature was not increased by the cooling/heating cycles, although after etching it slightly increased when the substrate thickness was 1.5 mm or less and when the t/A was less than 0.002; however, such curvature does not cause any problem for practical use. Furthermore, an evaluation was done in the same manner as described above using composite material samples prepared by the casting method described in EXAMPLE 2. The results were substantially the same as those shown in Table VI.

TABLE VI

| Sample | Thickness t (mm) | t/A (mm2) | Depth of Recess (mm) | Curvature (mm) | |
|---|---|---|---|---|---|
| | | | | Before Heat cycles | After Heat Cycles |
| Sample 4 in | 1.0 | 0.0011 | 0.5 | 0.04 | 0.04 |
| Table II | 1.5 | 0.0017 | 0.8 | 0.04 | 0.04 |
| | 1.8 | 0.0020 | 0.9 | 0.03 | 0.03 |
| | 2.0 | 0.0022 | 1.0 | 0.03 | 0.03 |
| Sample 9 in | 1.0 | 0.0011 | 0.5 | 0.04 | 0.04 |
| Table II | 1.5 | 0.0017 | 0.8 | 0.04 | 0.04 |
| | 1.8 | 0.0020 | 0.9 | 0.03 | 0.03 |
| | 2.0 | 0.0022 | 1.0 | 0.03 | 0.03 |

EXAMPLE 5

Composite material sheets were prepared according to ten kinds of compositions for Samples 2 to 5, 8 to 11, and 24 to 25 in Table II in EXAMPLE 1 by means of the sintering method used in EXAMPLE 1 and the casting method used in EXAMPLE 2. These composite material sheets were subjected to the same chemical etching processes, and heat-dissipating substrates were prepared which had a length (width) of 30 mm and a thickness of 1 mm, each having a square recess with a length (width) of 15 mm and a depth of 0.5 mm on a main face thereof. The main faces having a recess of these substrates were bonded respectively to aluminum nitride laminated circuits having a length (width) of 30 mm in the same manner as described in EXAMPLE 4 and thereby packages were fabricated, respectively.

Each package was subjected to 1,000 cooling/heating cycles in the same manner as described in EXAMPLE 1, and the curvature of the substrate was measured before and after the cooling/heating cycles with respect to its main face opposite to the main face having a recess, and the bonding portion connected to the laminated circuits was observed by a microscopic view to evaluate any occurrence of damage after the cooling/heating cycles. As a result, there was neither recognizable change in curvature nor damage to the bonding portion with respect to all the samples. Accordingly, the semiconductor device using the heat-dissipating substrate according to the present invention is highly reliable.

What is claimed is:

1. A heat-dissipating substrate made of a composite material comprising:
   a first composition primarily composed of aluminum; and
   a second composition primarily composed of silicon carbide and/or silicon,
   wherein the heat-dissipating substrate has a recess in one of its main faces, and the maximum amplitude in the depth direction of fine unevenness excluding the recess in the surface of a main face is smaller than the maximum length in the depth direction of composite particles comprising the first composition and the second composition or particles of the second composition, the composite particles and the particles being exposed at the surface of the main face.

2. A heat-dissipating substrate according to claim 1, wherein the roughness Ra of the two main faces excluding the recess is in the range of 0.2 to 2 $\mu$m in terms of roughness Ra defined in JIS B 0651.

3. A heat-dissipating substrate according to claim 1, wherein the main faces excluding the recess exhibit gray or light gray color without metallic luster.

4. A heat-dissipating substrate according to claim 1, wherein the first composition in the composite material is in the range of 55 to 96 percent by mass.

5. A heat-dissipating substrate according to claim 1, wherein the composite particles composed of the first composition and the second composition and the particles composed of the second composition have an average particle size in the range of 5 to 40 $\mu$m, respectively.

6. A heat-dissipating substrate according to claim 1, wherein the ratio of the maximum thickness t (mm) between the two main faces to the area A (mm$^2$) of a main face is 0.002 or less.

7. A heat-dissipating substrate according to claim 1, wherein the curvature of the heat-dissipating substrate in the thickness direction is 0.05 mm or less.

8. A method for making a heat-dissipating substrate, comprising:
   a step of preparing a composite material comprising a first composition primarily composed of aluminum and a second composition primarily composed of silicon carbide and/or silicon;
   a first etching step of forming a recess in a main face of the composite material by chemical etching; and
   a second etching step of forming fine unevenness except for the recess on main faces by chemical etching, such that the maximum amplitude of the fine unevenness in the depth direction of a main face is smaller than the maximum length in the depth direction of the composite particles comprising the first composition and the second component or the particles of the second composition, the composite particles and the particles being exposed at the surface of the main face.

9. A method for making heat-dissipating substrates according to claim 8, wherein the composite material is prepared in a sheet form for making a plurality of heat-dissipating substrates, and the recesses are formed at corresponding positions of the heat-dissipating substrates in the first etching step, allowing a frame having a small thickness to be formed around each of the heat-dissipating substrates so as to cause the heat-dissipating substrates to be separated at the frame.

10. A method for making the heat-dissipating substrate according to claim 8, wherein the chemical etching in the first etching step is performed with an alkaline or acidic aqueous etching solution containing 30 to 50 percent by mass of etchant.

11. A method for making the heat-dissipating substrate according to claim 8, wherein the chemical etching in the second etching step is performed with an alkaline or acidic aqueous etching solution containing 3 to 30 percent by mass of etchant.

12. A method for making heat-dissipating substrates according to claim 8, wherein the chemical etching in the first etching step or the second etching step is performed with the alkaline or acidic aqueous etching solution containing inorganic copper salt or chloride wherein the total etchant concentration in the solution is in the range of 3 to 50 percent by mass.

13. A method for making the heat-dissipating substrate according to claim 8, wherein the chemical etching in the first etching step or the second etching step is performed with the alkaline or acidic aqueous etching solution containing hydrogen fluoride.

14. A semiconductor device comprising the heat-dissipating substrate according to claim 1.

15. A semiconductor device comprising the heat-dissipating substrate according to claim 2.

16. A semiconductor device comprising the heat-dissipating substrate according to claim 3.

17. A semiconductor device comprising the heat-dissipating substrate according to claim 4.

18. A semiconductor device comprising the heat-dissipating substrate according to claim 5.

19. A semiconductor device comprising the heat-dissipating substrate according to claim 6.

20. A semiconductor device comprising the heat-dissipating substrate according to claim 7.

* * * * *